(12) United States Patent
Belot

(10) Patent No.: US 6,762,462 B2
(45) Date of Patent: Jul. 13, 2004

(54) STRUCTURE OF PROTECTION AGAINST NOISE

(75) Inventor: Didier Belot, Rives (FR)

(73) Assignee: STMicroelectronics S.A., Montrouge (FR)

(*) Notice: Subject to any disclaimer, the term of this patent is extended or adjusted under 35 U.S.C. 154(b) by 8 days.

(21) Appl. No.: 10/068,308

(22) Filed: Feb. 5, 2002

(65) Prior Publication Data
US 2002/0121649 A1 Sep. 5, 2002

(30) Foreign Application Priority Data
Feb. 5, 2001 (FR) .............................................. 01 01525

(51) Int. Cl.[7] .................................................. H01L 23/62
(52) U.S. Cl. ...................................... 257/361; 257/362
(58) Field of Search ................................ 257/361, 362, 257/375, 513

(56) References Cited

U.S. PATENT DOCUMENTS

| | | | | |
|---|---|---|---|---|
| 5,821,148 A | * | 10/1998 | Leighton et al. | 438/309 |
| 5,905,282 A | * | 5/1999 | Sato et al. | 257/328 |
| 6,232,645 B1 | * | 5/2001 | Belot | 257/516 |
| 6,514,799 B2 | * | 2/2003 | Litwin et al. | 438/129 |

FOREIGN PATENT DOCUMENTS

| | | |
|---|---|---|
| EP | 0 081 396 A2 | 6/1983 |
| FR | 2 787 636 | 6/2000 |

* cited by examiner

Primary Examiner—Phat X. Cao
(74) Attorney, Agent, or Firm—Lisa K. Jorgenson; Harold H. Bennett, II; Seed IP Law Group PLLC

(57) ABSTRACT

A structure of protection of an area of a semiconductor wafer including a lightly-doped substrate of a first conductivity type against high-frequency noise likely to be injected from components formed in the upper portion of a second area of the wafer. The structure includes a very heavily-doped wall of the first conductivity type having substantially the depth of the upper portion. The wall is divided into segments, each of which is connected to a ground plane.

13 Claims, 3 Drawing Sheets

STRUCTURE OF PROTECTION AGAINST NOISE

BACKGROUND OF THE INVENTION

1. Field of the Invention

The present invention relates to integrated circuits intended for operating at very high frequency and more specifically to such circuits, some portions of which are sensitive to noise signals. For example, in the field of telecommunications and of portable phones, it is desired to integrate on a same chip logic signal processing circuits and analog amplifying circuits, intended for operating at very high frequencies, greater than 1 GHz, ranging for example from 2 to 10 GHz. In particular, a low-noise analog amplifier directly connected to the antenna output is generally provided. It is important to avoid that the noise resulting from the switchings of the digital signals affects the amplifier inputs since this noise would then be injected back into the circuit with a very high gain.

2. Discussion of the Related Art

To test the sensitivity to noise of an integrated circuit and of various protection circuits, a test structure such as that shown in FIG. 1 may be used. In this test structure, the chip is divided into squares. For example, a chip portion having a 5-millimeter side is divided into 15×15 squares. A circuit likely to transmit square signals is formed in the first square (square C1-1 of the first column and of the first row) and the high-frequency signal collected in the other squares is studied. A portion of the component including the squares most diagonally distant from square C1-1 is surrounded with a protection structure 10. The quality of this protective structure is tested by comparing the noise collected in square C14-14 (fourteenth column, fourteenth row) arranged inside of the protective structure and the noise collected for example in square C1-15 (first column, fifteenth row) located substantially at the same distance from square C1-1 as the squares located inside of protective structure 10.

As illustrated by the partial cross-section view of FIG. 2, the case where the structure is formed on a lightly-doped P-type solid single-crystal silicon substrate 11 (P⁻) will be more specifically considered. The various components of the integrated circuit are assumed to be formed in an upper portion of this substrate, for example, in a lightly-doped N-type epitaxial layer, a portion 12 of which is shown at the limit of protective structure 10. The various components are for example directly formed in this epitaxial layer (in the case of some of the bipolar transistors) or in more heavily-doped P-type wells (13) or N-type wells (14) in which N-channel and P-channel MOS transistors will in particular be found. The protective structure is formed of a heavily-doped P-type wall 15 connected to ground.

Such a protective structure is efficient at frequencies smaller than 1 GHz. However, as illustrated in FIG. 3, the protection is no longer efficient when the frequencies increase. This is in particular due to the fact that the connection between heavily-doped wall 15 and the ground inevitably includes an inductance 1 having an impedance which increases along with frequency.

FIG. 3 shows the attenuation in dB at the level of square C1-15 and at the level of square C14-14 of a signal transmitted by square C1-1, according to frequency (in logarithmic scale), between 100 MHz and 10 GHz. In square C1-15, it can be seen that this attenuation decreases as the frequency increases. In square C14-14 (or in any other square located inside of protective structure 10), it can be seen that, until a frequency on the order of one gigahertz is reached, the attenuation is much greater than for square C1-15. However, for frequencies on the order of from 1 to 2 GHz, the slope of curve C14-14 changes and the attenuation caused by isolating wall 15 becomes negligible. It can even be acknowledged that, for frequencies greater than 2 GHz, the isolating wall has a negative effect, that is, the attenuation of the signal from square C1-1 is smaller in square C14-14, which is "protected" by isolating structure 10 than in square C1-15, which is not protected.

Various theoretical explanations could be found for this phenomenon, which in any case is certainly due to the fact that the impedance of the connection of isolating wall 15 to ground becomes high. Thus, in prior art, various means of reducing the value of this impedance have been tried. One of these means is to use a so-called "flip-chip" semiconductor chip assembly mode in which the connection points on the chip are metallized and coated with conductive balls. Each conductive ball is then directly put in contact with a metallized region of a printed circuit board to which this chip is to be connected. Connections with a much smaller impedance than in the case where the chips are assembled in a package and connected to the package tabs by wires are thus obtained. However, this has not enabled completely solving the problem posed and has only partially improved the features of known protection structures.

BRIEF SUMMARY OF THE INVENTION

An embodiment of the present invention provides a novel structure of protection against noise in an area of an integrated circuit formed on a massive substrate.

A structure of protection is provided for a first area of a semiconductor wafer including a lightly-doped substrate of a first conductivity type, against high-frequency noise likely to be injected from components formed in the upper portion of a second area of the wafer. The structure includes a very heavily-doped wall of the first conductivity type having substantially the depth of said upper portion, wherein said wall is divided into segments, each of which is connected to a ground plane.

According to an embodiment of the present invention, the first conductivity type is type P.

According to an embodiment of the present invention, the impedance between two successive segments is greater than the grounding impedance of each segment.

According to an embodiment of the present invention, each segment is connected to a ground plane via an assembly of flip-chip type.

According to an embodiment of the present invention, the isolating wall is surrounded with a medium-doped area of the first conductivity type.

BRIEF DESCRIPTION OF THE SEVERAL VIEWS OF THE DRAWINGS

The foregoing objects, features and advantages of the present invention will be discussed in detail in the following non-limiting description of specific embodiments in connection with the accompanying drawings.

DETAILED DESCRIPTION OF THE INVENTION

As usual in the representation of semiconductor components, the various cross-section views and top views of components are not drawn to scale in the various drawings. In these drawings, same references designate identical or similar elements.

Figure 4:
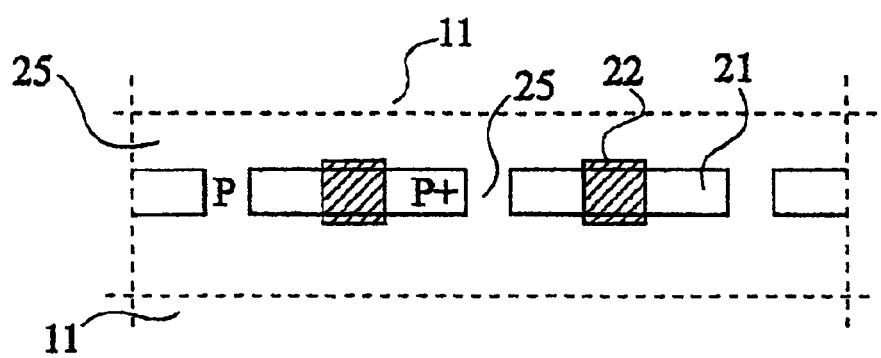
FIG. 4 shows a partial top view of an isolating wall according to the present invention.
Figure 5:
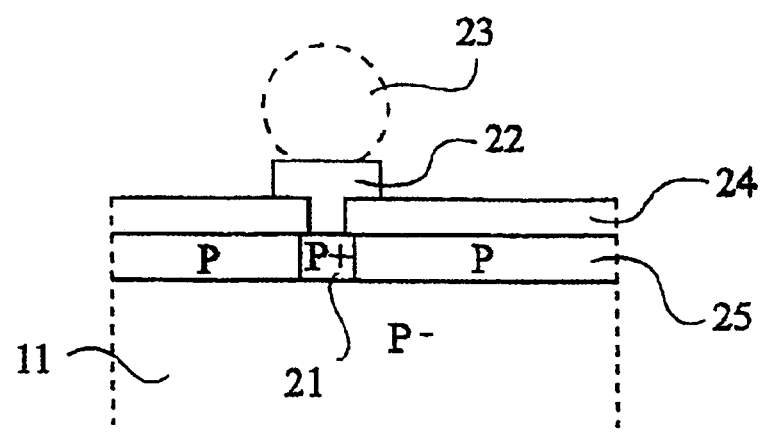
FIG. 5 shows a partial cross-section view of an isolating wall according to the present invention.

As illustrated in FIGS. 4 and 5, the isolating wall according to the present invention is divided into heavily-doped P-type segments 21 (P$^+$). A metallization 22 contacts each segment, and each of the metallizations 22 is independently connected to a ground plane. Preferably, this connection is obtained by a flip-chip type assembly such as previously described. Thus, as can be better seen from FIG. 5, each region 21 formed in a lightly-doped P-type substrate (P$^-$) is in contact with a metallization 22, itself topped with a welding ball 23 intended for ensuring the flip-chip assembly. Of course, this representation is extremely simplified and various ways of preparing connections for a flip-chip assembly are known in the art. An isolating layer 24 which is open at the locations where metallization 22 contacts segments 21 has been shown at the surface of the semiconductor wafer.

The depth of isolating wall 21 will be that of a heavily-doped P-type region (P$^+$) in the considered technology. Its width will preferably be smaller than the greatest length of a contact pad 22.

Preferably, the upper part of substrate 11 in the vicinity of the region of isolating wall 21 is formed of a P-type doped region 25 having a doping level intermediary between the doping of substrate 11 and the very heavy doping of region 21. Region 25 may for example extend over a distance greater than 100 μm on either side of isolating wall 21.

The interval between segments 21 and the doping of P-type region 25 are chosen so that the impedance between two segments is greater than or equal to the contact impedance between region 21 and the ground plane to which it is connected via metallization 22 and welding ball 23.

Figure 1:
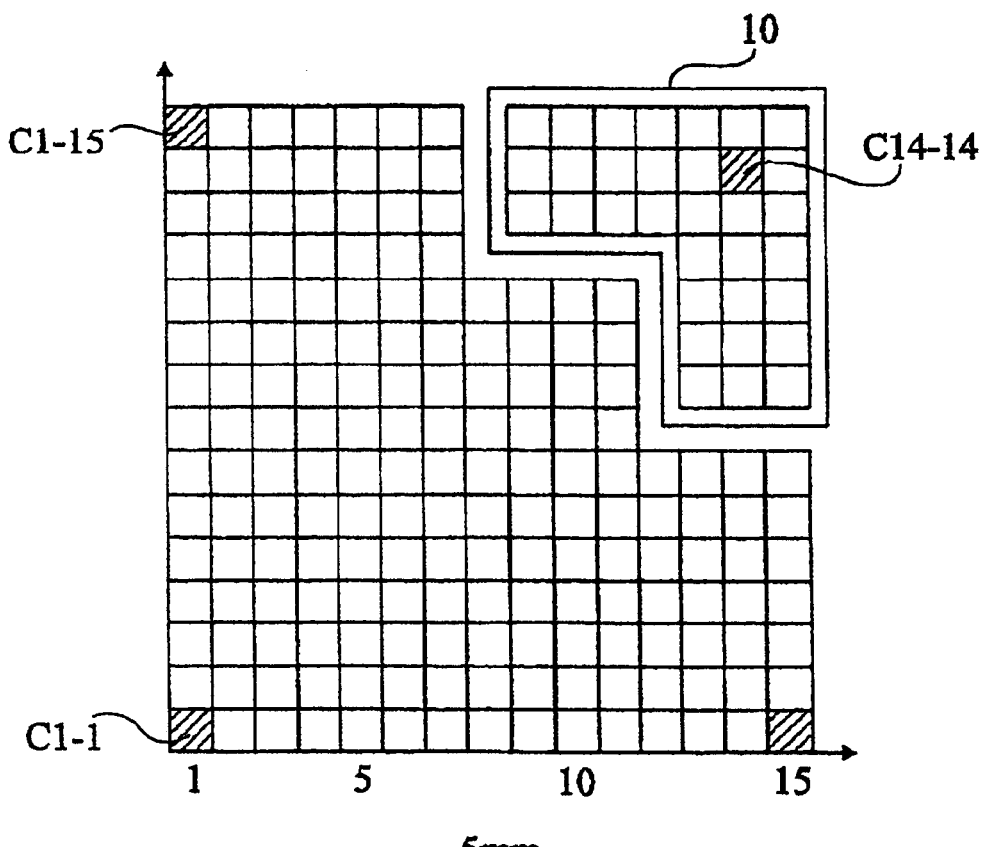
FIG. 1 shows an integrated circuit test structure.
Figure 2:
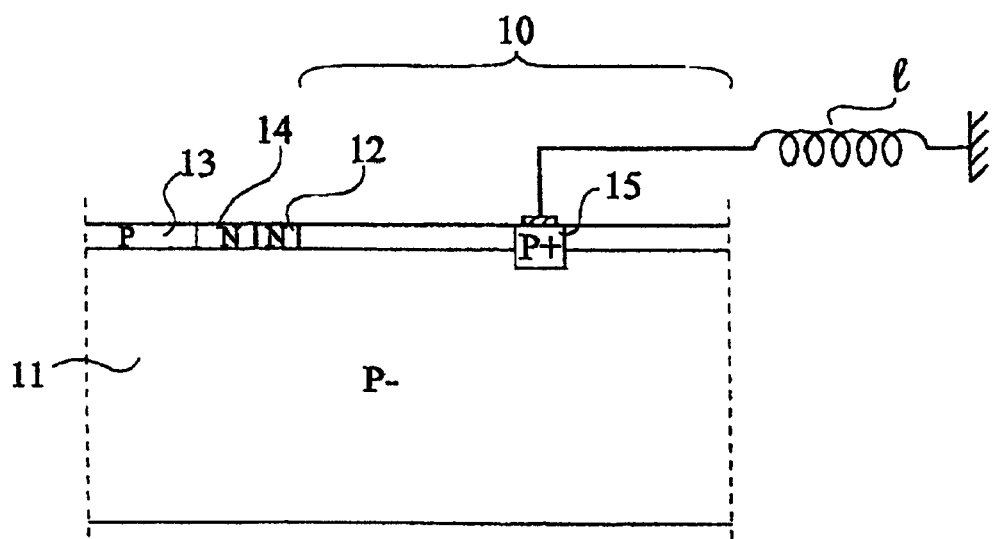
FIG. 2 shows a simplified cross-section view of a portion of an integrated circuit in the vicinity of an isolating wall.
Figure 3:
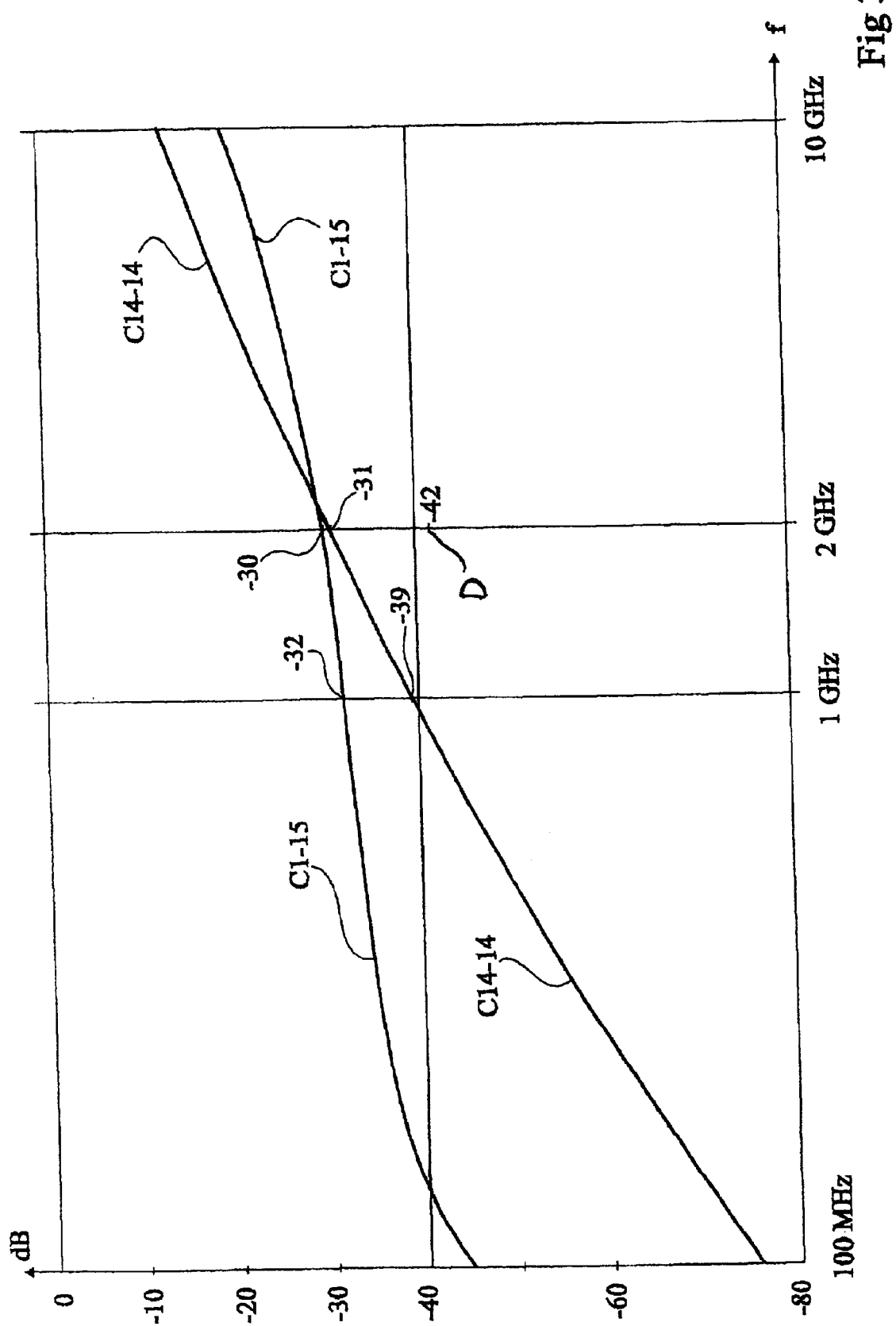
FIG. 3 shows the attenuation according to frequency at various points of the integrated circuit chip.

FIG. 3 shows the damping obtained at point D at a frequency of 2 GHz using the invention. As compared to the performance of the structure of FIG. 1, the inventive structure provides greater damping, shown in FIG. 3. At 2 GHz with the wall in dotted lines according to the present invention, all other things being equal, a −42-dB damping is obtained between squares C1-1 and C14-14 for a 2 GHz frequency, while this damping is only −31 dB with a continuous wall and the "natural" damping appearing on curve C1-15 is on the order of −30 dB. At other frequencies improved damping is also obtained using the invention.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A protection structure of a first area of a semiconductor wafer including a lightly-doped substrate of a first conductivity type against high-frequency noise likely to be injected from components formed in the upper portion of a second area of the wafer, comprising:
   a heavily-doped wall of the first conductivity type having substantially the depth of said upper portion, wherein said wall is divided into segments, each of which is connected to a ground plane via an assembly of flip chip type.

2. The protection structure of claim 1 wherein the first conductivity type is type P.

3. The protection structure of claim 1 wherein the impedance between two successive segments is greater than the grounding impedance of each segment.

4. The protection structure of claim 1 wherein the isolating wall is surrounded with a medium-doped area of the first conductivity type.

5. A device comprising:
   a semiconductor substrate; and
   a plurality of heavily doped segments of a first conductivity type formed in an upper portion of the semiconductor substrate, the segments configured to form a broken line enclosing a region of the semiconductor substrate, each of the segments configured to connected to a circuit ground via a flip-chip type connection.

6. The device of claim 5, further including a plurality of metalizations, each of the metalizations formed over and in contact with a respective one of the plurality of heavily doped segments.

7. The device of claim 6 wherein the metalizations are wider than the heavily doped segments.

8. A device comprising:
   a semiconductor substrate;
   a plurality of heavily doped segments formed in an upper portion of the semiconductor substrate, the segments configured to form a broken line enclosing a region of the semiconductor substrate, each of the segments being connected to a circuit ground;
   a plurality of metalizations, each of the metalizations formed over and in contact with a respective one of the plurality of heavily doped segments; and
   a solder ball formed on each of the plurality of metalizations.

9. A device comprising:
   a semiconductor substrate;
   a plurality of heavily dosed segments formed in an upper portion of the semiconductor substrate, the segments configured to form a broken line enclosing a region of the semiconductor substrate, each of the segments being connected to a circuit ground, and the impedance between any two adjacent segments being greater than the grounding impedance of each segment.

10. A device comprising:
    a semiconductor substrate;
    a plurality of heavily doped segments formed in an upper portion of the semiconductor substrate, the segments configured to form a broken line enclosing a region of the semiconductor substrate, each of the segments being connected to a circuit ground;
    a region of the semiconductor substrate surrounding the segments doped at a medium level of the first conductivity type, the region forming a continuous line superimposed by the broken line of heavily doped segments.

11. A device comprising:
    a semiconductor substrate;
    a logic circuit formed in the substrate;
    an analog circuit formed in the substrate; and
    a plurality of heavily doped segments formed in the semiconductor substrate, the segments configured to form a broken line between the logic circuit and the analog circuit, each of the segments being configured to connect to a circuit ground.

12. The device of claim 11 wherein each of the segments is configured to connect to a circuit ground via a flip-chip type connection.

13. The device of claim 11 wherein the logic circuit is configured to operate at frequencies greater than 1 GHz.

* * * * *

UNITED STATES PATENT AND TRADEMARK OFFICE
CERTIFICATE OF CORRECTION

PATENT NO.   : 6,762,462 B2
DATED        : July 13, 2004
INVENTOR(S)  : Didier Belot It is certified that error appears in the above-identified patent and that said Letters Patent is hereby corrected as shown below:

<u>Column 4,</u>
Line 10, "connected to a circuit" should read as -- connect to a circuit --.
Line 33, "heavily dosed segments" should read as -- heavily doped segments --.

Signed and Sealed this

Eighth Day of February, 2005

JON W. DUDAS
*Director of the United States Patent and Trademark Office*